(12) United States Patent
Yu et al.

(10) Patent No.: US 6,504,214 B1
(45) Date of Patent: Jan. 7, 2003

(54) MOSFET DEVICE HAVING HIGH-K DIELECTRIC LAYER

(75) Inventors: Bin Yu, Cupertino, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/044,246

(22) Filed: Jan. 11, 2002

(51) Int. Cl.[7] ............................................... H01L 29/78
(52) U.S. Cl. ..................... 257/347; 257/384; 257/410; 257/411
(58) Field of Search .................. 257/347, 382, 257/384, 410, 411

(56) References Cited

U.S. PATENT DOCUMENTS

| | | | |
|---|---|---|---|
| 5,798,555 A | * | 8/1998 | Mishra et al. ............... 257/410 |
| 6,013,553 A | | 1/2000 | Wallace et al. |
| 6,020,024 A | | 2/2000 | Maiti et al. |
| 6,171,910 B1 | * | 1/2001 | Hobbs et al. ............... 438/275 |
| 6,210,999 B1 | | 4/2001 | Gardner et al. |
| 6,232,641 B1 | * | 5/2001 | Miyano et al. .............. 257/382 |
| 6,261,887 B1 | * | 7/2001 | Rodder ......................... 438/218 |
| 6,300,202 B1 | * | 10/2001 | Hobbs et al. ............... 438/287 |
| 6,346,438 B1 | * | 2/2002 | Yagishita et al. ........... 438/197 |
| 6,407,435 B1 | * | 6/2002 | Ma et al. ..................... 257/411 |
| 2002/0031909 A1 | * | 3/2002 | Cabral et al. ............... 438/655 |

* cited by examiner

*Primary Examiner*—Carl Whitehead, Jr.
*Assistant Examiner*—Stephen W. Smoot
(74) *Attorney, Agent, or Firm*—Renner, Otto, Boisselle & Sklar, LLP

(57) ABSTRACT

A MOSFET device and method of fabrication. The MOSFET includes a gate having a gate electrode and a gate dielectric formed from a high-K material, the gate dielectric separating the gate electrode and a layer of semiconductor material. A source and a drain each formed by selective in-situ doped epitaxy and located adjacent opposite sides of the gate so as to define a body region from the layer of semiconductor material between the source and the drain and under the gate.

8 Claims, 2 Drawing Sheets

MOSFET DEVICE HAVING HIGH-K DIELECTRIC LAYER

TECHNICAL FIELD

The present invention relates generally to semiconductor devices and the fabrication thereof and, more particularly, to a semiconductor device having a dielectric made from high-K material and a method of formation having a low thermal budget.

BACKGROUND

A pervasive trend in modern integrated circuit manufacture is to produce semiconductor devices, such as metal oxide semiconductor field effect transistors (MOSFETs), that are as small as possible. In a typical MOSFET, a source and a drain are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer. It is noted that MOSFETs can be formed in bulk format (for example, the active region being formed in a silicon substrate) or in a semiconductor-on-insulator (SOI) format (for example, in a silicon film that is disposed on an insulating layer that is, in turn, disposed on a silicon substrate).

Although the fabrication of smaller transistors allows more transistors to be placed on a single monolithic substrate for the formation of relatively large circuit systems in a relatively small die area, this downscaling can result in a number of performance degrading effects. For example, certain materials selected to be used in a down-scaled device may react with other materials when a thermal budget for the materials is exceeded (for example, and depending on the material, when an anneal cycle approaches about 1000° C.).

Accordingly, there exists a need in the art for semiconductor devices, such as MOSFETs, that optimize scale and performance. There also exists a need for corresponding fabrication techniques to make those semiconductor devices.

SUMMARY OF THE INVENTION

According to one aspect of the invention, a MOSFET device. The MOSFET includes a layer of semiconductor material; a gate formed over the layer of semiconductor material, the gate including a gate electrode and a gate dielectric formed from a high-K material, the gate dielectric separating the gate electrode and the layer of semiconductor material; and a source and a drain each formed by selective in-situ doped epitaxy and located adjacent opposite sides of the gate so as to define a body region from the layer of semiconductor material between the source and the drain and under the gate.

According to another aspect of the invention, a method of fabricating a MOSFET device. The method including providing a layer of semiconductor material; forming a layer of high-K dielectric material over the layer of semiconductor material; forming a gate electrode over the layer of high-K dielectric material; removing a portion of the layer of high-K dielectric material extending laterally beyond the gate electrode to form a gate dielectric, the gate electrode and the gate dielectric forming a gate having laterally opposed sidewalls; removing a portion of the layer of semiconductor material extending laterally beyond each sidewall of the gate to form a source recess and a drain recess in the layer of semiconductor material; and forming a source in the source recess and a drain in the drain recess using selective in-situ doped epitaxy.

BRIEF DESCRIPTION OF DRAWINGS

These and further features of the present invention will be apparent with reference to the following description and drawings, wherein.

DISCLOSURE OF INVENTION

Figure 1:
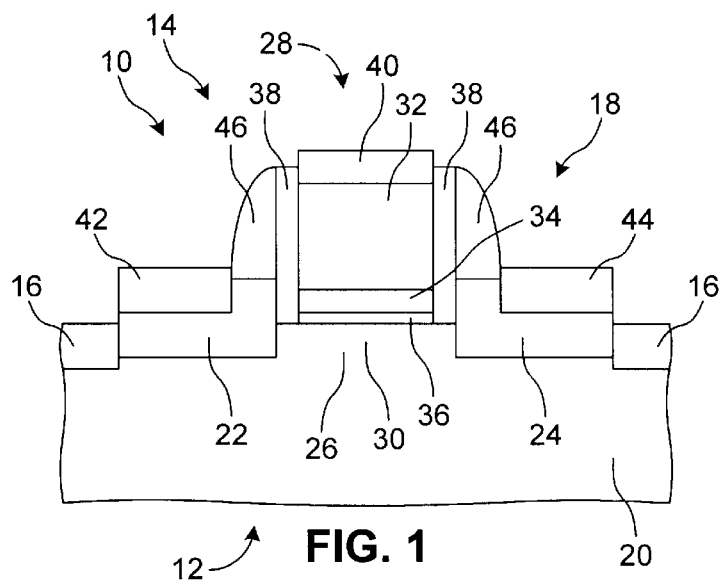
FIG. 1 is a schematic block diagram of a semiconductor device formed in accordance with one aspect of the present invention.

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

With reference to FIG. 1, a semiconductor device 10 fabricated on a wafer 12 according to an example embodiment of the present invention is illustrated. The illustrated semiconductor device 10 is a metal oxide semiconductor field effect transistors (MOSFET) used, for example, in the construction of a complimentary metal oxide semiconductor (CMOS) integrated circuit. As one skilled in the art will appreciate, the structures and the techniques for fabricating the semiconductor device 10 described herein can be used for other types of semiconductors (e.g., other types of transistors, memory cells, etc.) and the illustrated MOSFET is merely exemplary. However, to clearly and concisely set forth the present invention, the semiconductor device 10 will sometimes be referred to herein as a MOSFET 14. Although only one MOSFET 14 is illustrated, one skilled in the art will appreciate that the illustrated device is merely exemplary and multiple MOSFETs (including NMOS devices and/or PMOS devices) can be formed on the wafer 12. Multiple semiconductor devices 10 formed from the wafer can be separated by isolation regions 16 as is well known in the art.

The MOSFET 14 is formed using an active region 18 formed in a layer of semiconductor material 20. In the illustrated example of FIG. 1, the layer of semiconductor material 20 is a semiconductor substrate used for the formation of "bulk" type devices. The semiconductor substrate is made from silicon, but other semiconductor materials (e.g., silicon-germanium, germanium, etc.) could also be used. Alternatively, the layer of semiconductor material 20 can be a semiconductor film (for example, comprised of silicon, silicon-germanium, or the like) formed on a layer of insulating material (for example, a buried oxide (BOX) layer). The insulating layer is, in turn, formed on a semiconductor substrate (also referred to in the art as a handle wafer) so that devices formed on the wafer 12 are formed in a semiconductor-on-insulator (SOI) format.

The active region 18 includes a source 22, a drain 24 and a body 26 disposed between the source 22 and the drain 24. The source 22 and the drain 24 can be formed by an in-situ doped selective epitaxy technique as will be described in greater detail below.

A gate 28 is disposed on the layer of semiconductor material 20 over the body 26 and defines a channel 30 within the body 26 (the channel 30 being interposed between the source 22 and the drain 24 and controlled by a work function of the gate 28 ). The gate 28 includes a gate electrode 32 spaced apart from the layer of semiconductor material 20 by a gate dielectric 34. In one embodiment, the gate electrode can be made from a metal (e.g., tungsten, tantalum, aluminum, nickel, ruthenium, rhodium, palladium, platinum, titanium, molybdenum, etc) or a metal containing compound (e.g., titanium nitride, tantalum nitride, etc.). Alternatively, a semiconductor (e.g., polycrystalline silicon, polycrystalline silicon-germanium, etc.) could also be used for the gate electrode 32.

In one embodiment, the gate dielectric 34 is made from a high-K material or stack of materials to form a high-K dielectric stack. As used herein, a "high-K material" or a "high-K dielectric material" refers to a material, or stack of materials, having a relative permitivity in one embodiment of about ten (10) or more, and in another embodiment of about twenty (20) or more. Relative permitivity is the ratio of the absolute permitivity ($\in$) found by measuring capacitance of the material to the permitivity of free space ($\in_o$) that is $K=\in/\in_o$. High-K materials will be described in greater detail below. Although other materials can be selected for the gate dielectric 34, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are example suitable materials for the gate dielectric 34. In addition, all binary and ternary metal oxides and ferroelectric materials having a K higher than, in one embodiment, about twenty (20) can be used for the gate dielectric 34.

In an alternative embodiment, the gate dielectric 34 can be made from a standard-K material. As used herein, the term "standard-K dielectric material" or "standard-K dielectric material refers to a dielectric material having a relative permitivity, or K, of up to about ten (10). Example standard-K materials include, for example, silicon dioxide (K of about 3.9), silicon oxynitride (K of about 4 to 8 depending on the relative content of oxygen and nitrogen) and silicon nitride (K of about 6 to 9).

When a high-K material is selected as the gate dielectric 34, the high-K material can have an equivalent oxide thickness (EOT) of about one nanometer (1 nm) or less. In the semiconductor device 10 described herein, a gate dielectric made from a high-K material may be desirable to minimize performance degrading effects, such as leakage, that may occur when the thickness of a standard-K dielectric material becomes thin (e.g., approaching about 10 Å). A high-K dielectric allows for the establishment of a suitable capacitance with a physically thicker dielectric layer. For example, a nitride gate dielectric having a K of about 7.8 and a thickness of about 100 Å is substantially electrically equivalent to an oxide gate dielectric having a K of about 3.9 and a thickness of about 50 Å. In addition, devices fabricated with a high-K dielectric layer tend to have improved reliability.

When a high-K material is selected as the gate dielectric 34, a buffer interface 36 optionally can be used between the layer of semiconductor material 20 and the gate dielectric 34. The buffer interface 36 can be, for example, an oxide layer having a thickness of about 0.5 nm to about 0.7 nm. The buffer interface 36 acts to reduce diffusion and/or penetration of atoms from the high-K dielectric material into the layer of semiconductor material 20 that could lead to a degradation in channel mobility. In addition, the buffer interface 36 may act to retard reaction of the high-K material with the layer of semiconductor material 20.

The MOSFET 14 can be provided with a liner 38 disposed adjacent each sidewall of the gate 28 to assist in fabrication of the MOSFET 14 and to isolate the source 22 and the drain 24 from the gate electrode 32 as will be described in greater detail below. The liners 38 can be made from an oxide (e.g., silicon oxide) and can be relatively thick. For example, the liners 38 can be about 80 Å to about 120 Å wide.

Also, the MOSFET 14 can be provided with a gate electrode contact 40 used in establishing electrical connection to the gate electrode 32. In the illustrated example of FIG. 1, the gate electrode 32 is made from a semiconductor material and the gate electrode contact 40 is formed by siliciding the gate electrode 32. In other embodiments (e.g., when a metal gate electrode 32 is used), the gate electrode contact 40 can be made from another material (such as a metal) or omitted. A source contact 42 and a drain contact 44 can also be provided. In one embodiment, the source contact 42 and the drain contact 44 are formed by siliciding the source 22 and the drain 24 respectively. Sidewall spacers 46 can be used to define the placement of the source contact 42 and the drain contact 44 with respect to the gate 28. The spacers 46 can be made from an oxide (e.g., silicon oxide) or a nitride (e.g., silicon nitride) and each can have a width of about 300 Å to 600 Å.

Other components, such as a cap (or passivation) layer (not shown), vias (not shown), and conductor lines (not shown) to interconnect devices formed on the wafer 12, can also be provided.

Figure 2:
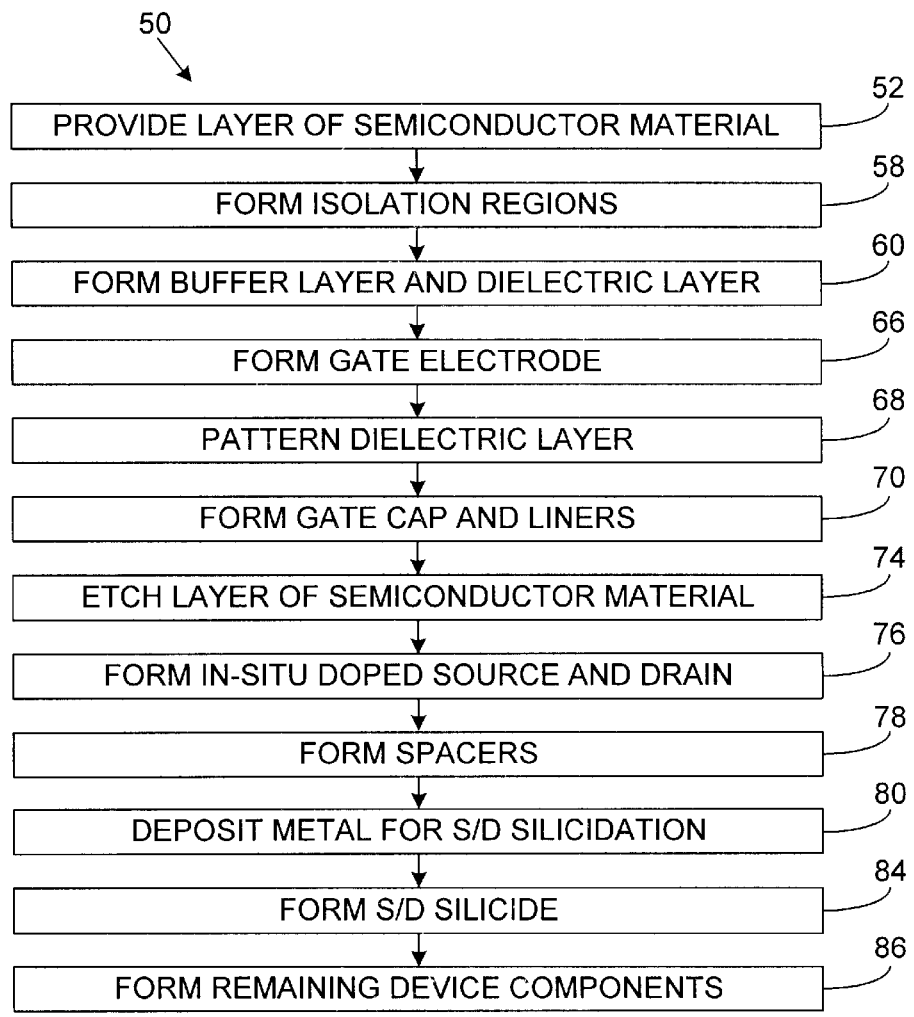
FIG. 2 is a flow chart illustrating a method of forming the semiconductor device of FIG. 1.

Referring now to FIG. 2, a method 50 of forming the MOSFET 14 is illustrated. With additional reference to FIG. 3A, the method 50 starts in step 52 where the layer of semiconductor material 20 is provided. As indicated above, the layer of semiconductor material 20 can be a semiconductor substrate, such as a silicon substrate. Alternatively, and as illustrated in FIGS. 3A–3D, the layer of semiconductor material 20 can be a semiconductor film (such as a silicon film or a silicon-germanium film) formed on an insulating layer 54 (such as a BOX layer). The insulating layer 54 can be formed on a semiconductor substrate 56 (such as a silicon substrate) so as to form an SOI substrate stack. If appropriate, the layer of semiconductor material 20 can be doped with N-type and/or P-type dopant for used in the formation of N-type body regions 26 and/or P-type body regions 26 (including, for example, N-type and/or P-type wells for a bulk-type device).

Next, in step 58 and if desired, the isolation regions 16 can be formed. The isolation regions 16 define the size and placement of the active regions 18 (FIG. 1). The formation of isolation regions 16 is well known in the art and will not be described in great detail. The isolation regions 16 can be formed using a shallow trench isolation (STI) formation technique as is conventional.

Next, in step 60, a buffer interface material layer 62 optionally can be formed on the layer of semiconductor material 20. As indicated, the buffer interface material layer 62 can be a thin layer of oxide. For example, the buffer interface material layer 62 can be a layer of silicon oxide that is about 0.5 nm to about 0.7 nm thick. The buffer interface material layer 62 can be formed by a low temperature (about 500° C.) thermal oxidation process, a remote plasma deposition process, an atomic layer deposition (ALD) process or the like. The buffer interface material layer 62 assists in reducing integration issues that may arise when attempting form a layer of high-K material on a semiconductor layer.

Therefore, if the gate dielectric is formed from a standard-K material or if the buffer interface 36 is not desired, formation of the buffer interface material layer 62 can be omitted.

Also in step 60, a layer of dielectric material 64 is formed on the buffer interface material layer 62 (if the buffer interface material layer 62 is omitted, the layer of dielectric material 64 can be formed on the layer of semiconductor material 20 or other intermediate layer formed in place of the buffer interface material layer 62). As indicated above, the layer of dielectric material 64 can be a standard-K dielectric material. Alternatively, the layer of dielectric material 64 is formed from a high-K dielectric material or a stack of materials that, in combination, have high-K dielectric properties.

Exemplary high-K materials are identified below in Table 1. It is noted that Table 1 is not an exhaustive list of high-K materials and other high-K materials may be available.

TABLE 1

| Dielectric Material | Approximate Relative Permitivity (K) |
|---|---|
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| halfnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium oxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20—200 |
| barium strontium oxide ($Ba_{1-x}Sr_xO_3$) | ~20—200 |
| $PbTiO_3$ | ~20—200 |
| barium titanate ($BaTiO_3$) | ~20—200 |
| strontium titanate $SrTiO_3$ | ~20—200 |
| $PbZrO_3$ | ~20—200 |
| PST ($PbSc_xTa_{1-x}O_3$) | 3000 |
| PZN ($PbZn_xNb_{1-x}O_3$) | ~500—5000 |
| PZT ($PbZr_xTi_{1-x}O_3$) | ~150—1000 |
| PMN ($PbMg_xNb_{1-x}O_3$) | ~500—5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Figure 3A:
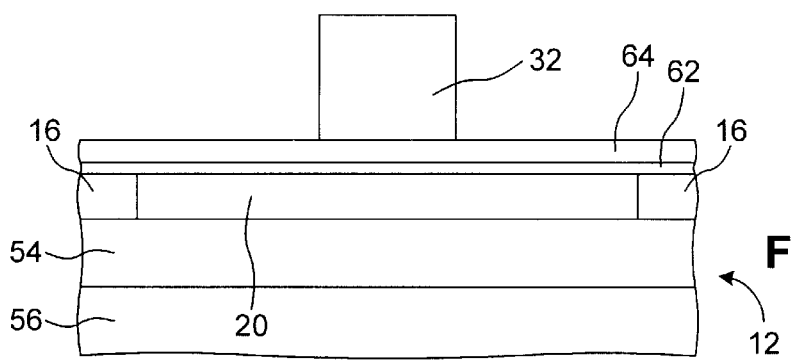
FIGS. 3A through 3D illustrate the semiconductor device of FIG. 1 in various stages of manufacture.

With continued reference to FIGS. 2 and 3A, the method 50 continues in step 66 where the gate electrode 32 is formed. The gate electrode 32 can be formed by depositing a layer of gate electrode material and patterning the layer of gate electrode material (for example, by using a photoresist and wet-chemical etch). In one embodiment of the MOSFET 14, the material of gate electrode 32 can be selected for use in an NMOS device, such as a metal (e.g., tungsten, tantalum, aluminum, etc.) or a metal containing compound (e.g., titanium nitride, tantalum nitride, etc.). If desired, a doped semiconductor (e.g., polycrystalline silicon, polycrystalline silicon-germanium, etc.) could alternatively be used. In another embodiment, the material of the gate electrode 32 can be selected for use in a PMOS device, such as a metal (e.g., tungsten, nickel, ruthenium, rhodium, palladium, platinum, etc.) or a metal containing compound (e.g., titanium nitride, tantalum nitride, etc.). If desired, a doped semiconductor (e.g., polycrystalline silicon, polycrystalline silicon-germanium, etc.) could alternatively be used. As one skilled in the art will appreciate, step 66 can be modified to form gate electrodes 32 for both NMOS devices and PMOS devices on the wafer 12.

Figure 3B:
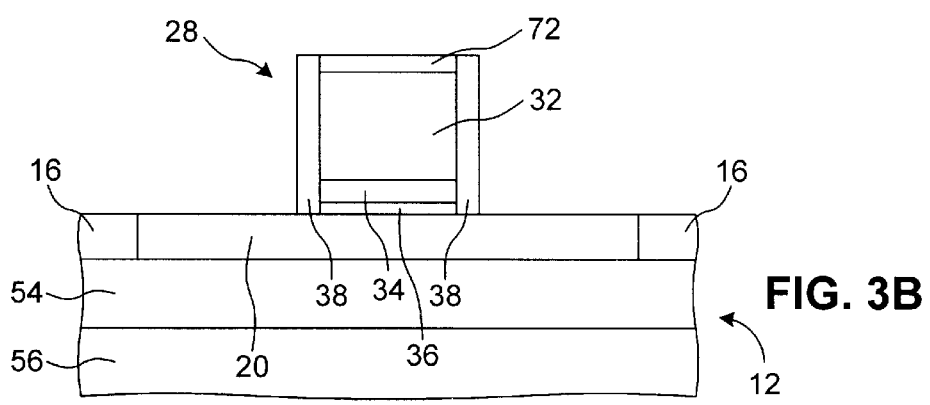

With additional reference to FIG. 3B, in step 68 the layer of dielectric material 64 and, if present, the buffer interface material layer 62 are pattered to be coextensive with the gate electrode 32, thereby forming the gate dielectric 34 and the buffer interface 36. Thereafter, in step 70, a cap 72 can be formed on the gate electrode 32. The cap 72 serves as an antireflective coating during a subsequent lithography step that is carried out to pattern a mask used while etching the layer of semiconductor material 20 as described below with respect to step 74. The cap 72 also protects the gate electrode 32 during etching of the layer of semiconductor material 20 to form a source recess and a drain recess and during source/drain formation (described below with respect to steps 74 and 76). If the gate electrodes 32 is formed from a metal or metal containing compound, the cap 72 can be omitted. The cap 72 can be made from a dielectric material, such as silicon nitride (e.g., $Si_2N_4$) and can have a thickness of about 200 Å to about 300 Å. Techniques for forming the cap 72 are well known in the art and will not be described in detail.

Also in step 70, the liners 38 can be formed. The liners 38 can be made from an oxide (e.g., silicon oxide) and can have a width of about 80 Å to about 120 Å. The liners 38 can be formed, for example, by a deposit and etch technique as is well known in the art. The liners 38 act to protect the gate 28 during processing steps to form the source 20 and the drain 22 as discussed in greater detail below. In addition, the liners 38 can act to electrically isolate the source 22 and the drain 24 from the gate electrode 32 since upper portions of the source 22 and the drain 24 may be formed to be higher than the gate dielectric 34 as discussed in greater detail below.

Figure 3C:
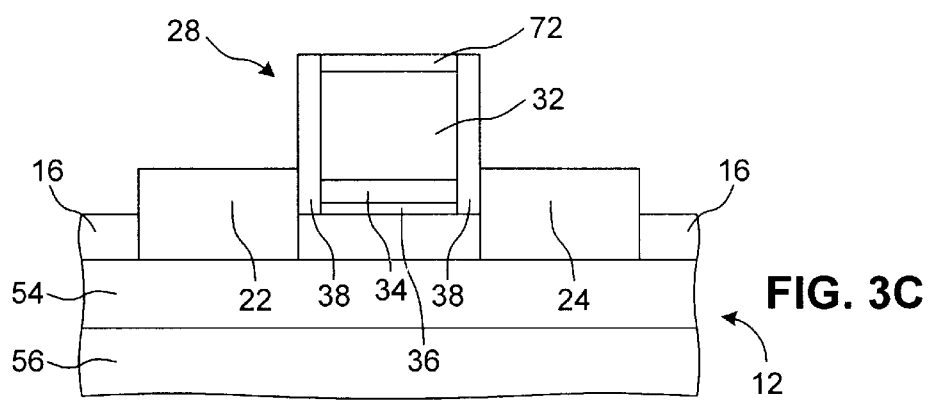

Next, in step 74 and as illustrated in FIG. 3C, portions of the layer of semiconductor material 20 disposed between the isolation regions 16 and the gate 28 are removed. As a result, portions of the layer of semiconductor material 20 extending laterally beyond each sidewall of the gate are removed to form a source recess and a drain recess. If desired, a mask (such as a photoresist patterned using photolithography) can be used to control etching of the layer of semiconductor material 20. In one embodiment, the layer of semiconductor material 20 is etched to a depth of about 200 Å to about 300 Å. If the layer of semiconductor material 20 is part of an SOI stack, the layer of semiconductor material 20 can be etched to the insulating layer 54.

Thereafter, in step 76, the source 22 and the drain 24 are formed. More particularly, the source 22 and the drain 24 can be formed by a process such as low temperature (e.g., about 350° C. to about 600° C.) selective silicon or silicon-germanium epitaxy. Such a process can be used to deposit semiconductor material on the etched portion of the layer of semiconductor material 20 (i.e., between the isolation regions 16 and the gate 28 in the source recess and the drain recess). In one embodiment, the deposited material can have a thickness of about 300 Å to about 500 Å. During this epitaxy process, N-type or P-type dopant species can be introduced such that the source 22 and the drain 24 are in-situ doped as they are being formed. For an N-type source 22 and/or an N-type drain 24, impurities such as antimony, phosphorous or arsenic can be introduced during the epitaxy process. For a P-type source 22 and/or a P-type drain 24, impurities such as boron, gallium or indium can be introduced during the epitaxy process. In is noted that the in one embodiment of the invention, the layer of semiconductor material 20 can be etched to form an undercut disposed under the liners 38 and possibly under the gate 28. In this embodiment, the source 22 and the drain 24 can be formed to extend under the liners 38 and, if desired, partially under the gate 28.

Figure 3D:
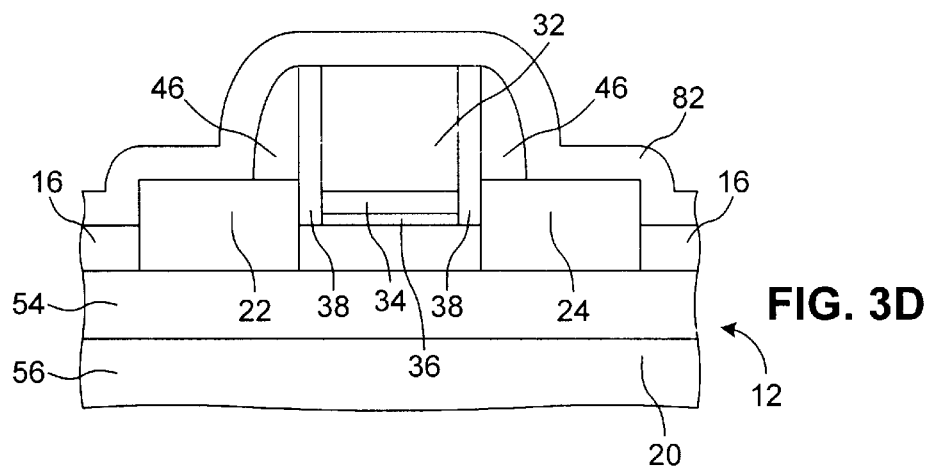

Next, in step 78 and with additional reference to FIG. 3D, the sidewall spacers 46 are formed. As indicated, the spacers 46 can be made from an oxide (e.g., silicon oxide) or a nitride (e.g., silicon nitride) and each can have a width of about 300 Å to 600 Å. The formation of spacers 46 is well known in the art (such as by depositing a layer of material, planarizing the material and anisotropically etching the material back to an underlying layer) and will not be discussed in great detail.

Thereafter, in step 80, the cap 72 can be removed (for example, by chemical-mechanical planarization (CMP)) and a conformal metal layer 82 can be deposited. The metal later 82 is used in the formation of silicide for the gate electrode contact 40 (FIG. 1) (when the gate electrode 32 is made from a semiconductor material), the source contact 42 (FIG. 1) and the drain contact 44 (FIG. 1). In one embodiment, the metal layer 82 is nickel (Ni). Alternatively, the metal layer 82 can be titanium, cobalt, platinum, molybdenum, or other suitable material for the formation of silicide. Deposition techniques for forming the metal layer 82, such as sputtering, are well known in the art and will not be described in greater detail.

Next, in step 84 and with additional reference to FIG. 1, the metal layer 82 is reacted with the gate electrode 32 (if the gate electrode is made from a semiconductor material), the source 22 and the drain 24 to form silicide for the contacts 40, 42 and 44. Reaction of the metal layer 82 may include annealing the wafer 12. For example, if nickel is used for the metal layer 82, the wafer can be annealed at a relative low temperature (about 350° C. to about 450° C.).

Thereafter, in step 86, any additional processing to form the MOSFET 14 and/or interconnect the MOSFET 14 with other devices formed on the wafer 12 can be carried out.

It is noted that many high-k materials can have a tendency to react with adjacent semiconductor material layers (e.g., the layer of semiconductor material 20 and/or the gate electrode 32 if made from a semiconductor material such as polycrystalline silicon) when a thermal budget for the high-K material is exceeded. In addition, exceeding a thermal budget for the high-K material may cause metal atoms to diffuse and/or penetrate into the layer off semiconductor material 20, which could degrade channel mobility. The semiconductor device 10 described herein is formed without conventional ion implant implantation to form source and drain extensions and deep implant regions (i.e., diffusion source/drain junctions). Ion implantation is usually followed by an associated anneal cycle(s) to activate those dopant species and/or to recrystalize the layer of semiconductor material. Therefore, the high-K materials used to form the gate dielectrics are not subjected to certain thermal processing typically carried out in the fabrication of many semiconductor devices. Without intending to be bound by theory, it is believed that the foregoing thermal budget issue is minimized for the semiconductor device 10 described herein.

The method 50 shows a specific order of steps for fabricating the MOSFET 14. However, it is understood that the order may differ from that depicted. For example, the order of two or more steps may be altered relative to the order shown. Also, two or more steps may be carried out concurrently or with partial concurrence. In addition, various steps may be omitted and other steps may be added. Furthermore, the method 50 can be modified for the formation of devices other than MOSFETs (e.g., a memory cell, another type of transistor, etc.). It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A MOSFET comprising:

a layer of semiconductor material;

a gate formed over the layer of semiconductor material, the gate including a gate electrode and a gate dielectric formed from a high-K material, the gate dielectric separating the gate electrode and the layer of semiconductor material;

a source and a drain each formed by selective in-situ doped epitaxy and located adjacent opposite sides of the gate so as to define a body region from the layer of semiconductor material between the source and the drain and under the gate, wherein an upper portion of each of the source and the drain adjacent the body region extend higher than the gate dielectric and a lower portion of each of the source and the drain form a junction with the body region;

a liner disposed adjacent each sidewall of the gate electrode, said liners separating the gate electrode from the upper portion of the source and the drain; and a sidewall spacer disposed adjacent each of the liners, the sidewall spacers disposed on the upper portions of the source and drain and defining the lateral placement of a source contact and a drain contact.

2. The MOSFET according to claim 1, wherein the source and the drain are respectively formed in a source recess and a drain recess etched into the layer of semiconductor material.

3. The MOSFET according to claim 1, wherein the high-K material is composed of one or more materials selected from hafnium oxide, zirconium oxide, cerium oxide, aluminum oxide, titanium oxide, yttrium oxide, barium strontium titanate and mixtures thereof.

4. The MOSFET according to claim 1, further comprising a buffer interface disposed between the gate dielectric and the body region.

5. The MOSFET according to claim 4, wherein the buffer interface is formed from an oxide having a thickness of about 0.5 nm to about 0.7 nm.

6. The MOSFET according to claim 1, further comprising a silicide source contact and a silicide drain contact for respectively establishing electrical connection to the source and the drain.

7. The MOSFET according to claim 6, wherein the silicide of the source contact and the drain contact is formed by reacting nickel with the source and the drain respectively.

8. The MOSFET according to claim 1, wherein the layer of semiconductor material is a semiconductor film disposed on an insulating layer, the insulating layer being disposed on a semiconductor substrate.

* * * * *

UNITED STATES PATENT AND TRADEMARK OFFICE
CERTIFICATE OF CORRECTION

PATENT NO.    : 6,504,214 B1
DATED         : January 7, 2003
INVENTOR(S)   : Yu et al.

It is certified that error appears in the above-identified patent and that said Letters Patent is hereby corrected as shown below:

Column 5,
Line 31, Table 1, replace "titanium oxide" with -- titanium dioxide --

Column 6,
Line 31, replace "pattered" with -- patterned --
Line 42, replace "electrodes" with -- electrode --

Signed and Sealed this

Twenty-fifth Day of March, 2003

JAMES E. ROGAN
*Director of the United States Patent and Trademark Office*